United States Patent
Niimi et al.

(10) Patent No.: US 8,216,913 B2
(45) Date of Patent: Jul. 10, 2012

(54) STRAIN MODULATION IN ACTIVE AREAS BY CONTROLLED INCORPORATION OF NITROGEN AT SI-SIO2 INTERFACE

(75) Inventors: Hiroaki Niimi, Dallas, TX (US); Elisabeth Marley, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 287 days.

(21) Appl. No.: 12/343,780

(22) Filed: Dec. 24, 2008

(65) Prior Publication Data

US 2009/0159981 A1 Jun. 25, 2009

Related U.S. Application Data

(60) Provisional application No. 61/016,541, filed on Dec. 24, 2007.

(51) Int. Cl.
*H01L 21/76* (2006.01)
(52) U.S. Cl. ............... 438/424; 438/434; 257/E21.548; 257/E21.551
(58) Field of Classification Search .......... 438/197–200, 438/424–440; 257/E21.548, E21.551
See application file for complete search history.

(56) References Cited

U.S. PATENT DOCUMENTS

| | | | |
|---|---|---|---|
| 6,093,611 A * | 7/2000 | Gardner et al. | 438/295 |
| 7,199,020 B2 | 4/2007 | Mehrotra et al. | |
| 2002/0055236 A1 * | 5/2002 | Chen | 438/437 |
| 2002/0086495 A1 * | 7/2002 | Yoo et al. | 438/423 |
| 2006/0022242 A1 * | 2/2006 | Sugatani et al. | 257/296 |
| 2006/0183292 A1 * | 8/2006 | Chen et al. | 438/400 |

* cited by examiner

*Primary Examiner* — Brook Kebede
(74) *Attorney, Agent, or Firm* — Jacqueline J. Garner; Wade J. Brady, III; Frederick J. Telecky, Jr.

(57) ABSTRACT

Adding nitrogen to the Si—SiO2 interface at STI sidewalls increases carrier mobility in MOS transistors, but control of the amount of nitrogen has been problematic due to loss of the nitrogen during liner oxide growth. This invention discloses a method of forming STI regions which have a controllable layer of nitrogen atoms at the STI sidewall interface. Nitridation is performed on the STI sidewalls by exposure to a nitrogen-containing plasma, by exposure to NH3 gas at high temperatures, or by deposition of a nitrogen-containing thin film. Nitrogen is maintained at a level of $1.0 \cdot 10^{15}$ to $3.0 \cdot 10^{15}$ atoms/cm$^2$, preferably $2.0 \cdot 10^{15}$ to $2.4 \cdot 10^{15}$ atoms/cm$^2$, at the interface after growth of a liner oxide by adding nitrogen-containing gases to an oxidation ambient. The density of nitrogen is adjusted to maximize stress in a transistor adjacent to the STI regions. An IC fabricated according to the inventive method is also disclosed.

14 Claims, 12 Drawing Sheets

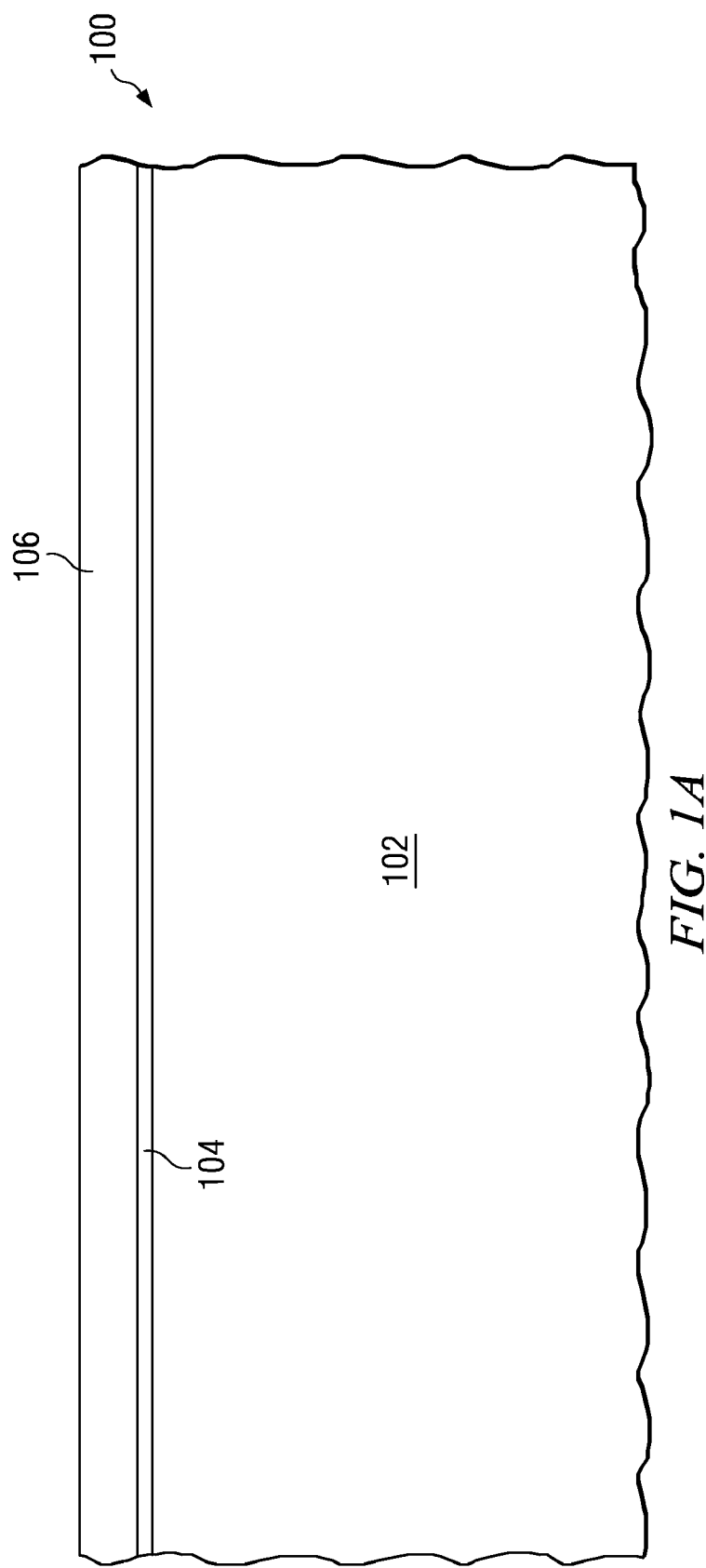

STRAIN MODULATION IN ACTIVE AREAS BY CONTROLLED INCORPORATION OF NITROGEN AT SI-SIO2 INTERFACE

FIELD OF THE INVENTION

This invention relates to the field of integrated circuits. More particularly, this invention relates to methods to improve control of lattice strain in MOS transistors.

BACKGROUND OF THE INVENTION

It is well known that stress in the silicon lattice of an MOS transistor in an integrated circuit (IC) increases the mobility of the charge carriers in the channel of the transistor under the gate, and hence improves the on-state drive current. There are various methods to provide stress to the active area containing the MOS transistor, including formation of a stress inducing liner in the field oxide regions adjacent to the transistors formed by shallow trench isolation (STI). STI field oxide regions are formed by etching a trench into the silicon substrate of the IC, growing a liner oxide on the trench sidewalls, and filling the trench with silicon dioxide. The liner oxide provides a small level stress to the active area adjacent to the trench. It is known that adding nitrogen to an interface between the silicon substrate at the STI sidewall and the liner oxide increases the stress in the active area, but control of the amount of nitrogen has been problematic.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The invention provides a method of forming shallow trench isolation (STI) regions in an integrated circuit which have a controllable layer of nitrogen atoms at an interface between the integrated circuit substrate and a liner oxide in the STI trenches. In a specific embodiment, nitridation is accomplished after the STI trenches are etched by exposure to a nitrogen-containing plasma, by exposure to NH3 gas at high temperatures, or by deposition of a nitrogen-containing thin film on sidewalls of the STI trenches. The nitrogen is maintained at the interface at a level of $1.0 \cdot 10^{15}$ to $3.0 \cdot 10^{15}$ atoms/cm$^2$, preferably $2.0 \cdot 10^{15}$ to $2.4 \cdot 10^{15}$ atoms/cm$^2$, after growth of a liner oxide by adding nitrogen-containing gases to an oxidation ambient during a liner oxidation process. The density of nitrogen atoms is adjusted to provide a maximum stress in a transistor adjacent to the STI regions. An integrated circuit fabricated according to the instant invention is also disclosed.

DESCRIPTION OF THE VIEWS OF THE DRAWING

FIG. 1A through FIG. 1J are cross-sections of an integrated circuit (IC) containing an NMOS transistor and a PMOS transistor, depicted at various steps in the fabrication process sequence, embodying the instant invention.

DETAILED DESCRIPTION

Figure 1B:
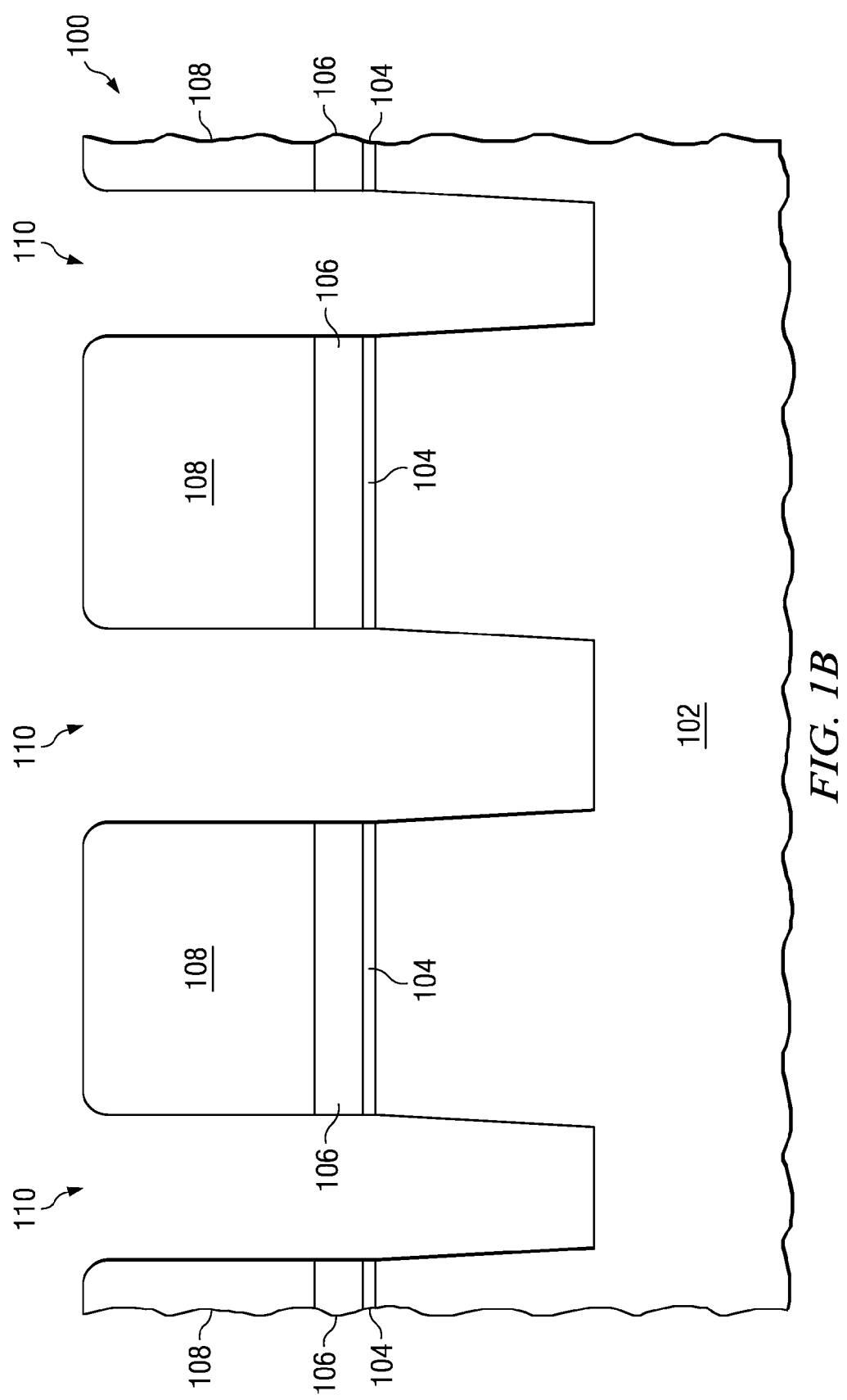

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "NMOS transistor" will be understood to refer to an n-channel metal oxide semiconductor transistor. Similarly, the term "PMOS transistor" will be understood to refer to a p-channel metal oxide semiconductor transistor.

The need for control of nitrogen content in a liner oxide of a shallow trench isolation (STI) field oxide region is addressed by the instant invention, which provides a method of forming STI field oxide in which a nitrogen density of $1.0 \cdot 10^{15}$ to $3.0 \cdot 10^{15}$ atoms/cm$^2$, preferably $2.0 \cdot 10^{15}$ to $2.4 \cdot 10^{15}$ atoms/cm$^2$, is present at an interface between the liner oxide and silicon substrate material extending to a top surface of the substrate, commonly known as the active area.

FIG. 1A through FIG. 1J are cross-sections of an integrated circuit (IC) containing an NMOS transistor and a PMOS transistor, depicted at various steps in the fabrication process sequence, embodying the instant invention. FIG. 1A depicts the IC (100) which includes a substrate (102), typically p-type silicon doped to an electrical resistivity of 1 to 100 ohm-cm. Fabrication of the inventive transistor according to an embodiment of the instant invention begins with formation of a layer of pad oxide (104), also known as dummy oxide, typically thermally grown silicon dioxide 5 to 50 nanometers thick, on a top surface of the substrate (102). A layer of active area hard mask (106), typically silicon nitride 50 to 250 nanometers thick, is formed on a top surface of the pad oxide layer (104).

Referring to FIG. 1B, fabrication of the transistor continues with formation of a first photoresist pattern (108) using known photolithographic techniques, to define regions for STI field oxide. Portions of the active area hard mask layer (106) in regions exposed by the first photoresist pattern (108) are removed by etching, typically in a plasma etcher, using known techniques. Portions of the pad oxide layer (104) in regions exposed by removal of the portions of active area hard mask are removed by etching, typically in a plasma etcher, using known techniques. Regions of silicon in the substrate (102), which are exposed on a top surface by the removal of the regions of pad oxide, are removed by etching, typically in a plasma etcher, using known techniques, to form STI trenches (110) 300 to 600 nanometers deep to define regions for STI field oxide. After the STI trenches (110) are formed, the first photoresist pattern (108) is removed by known dry and wet cleaning processes.

Figure 1C:
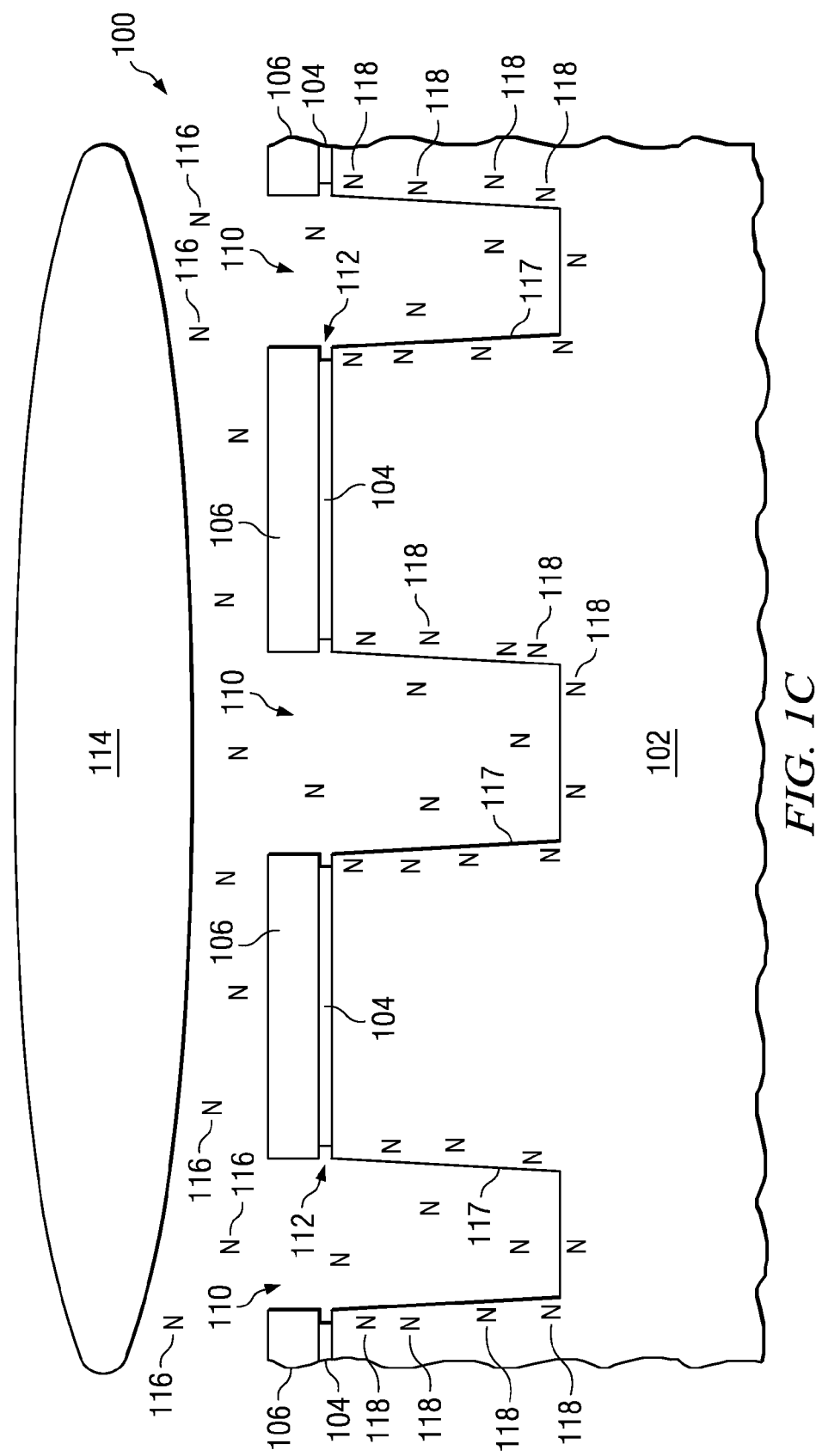

Referring to FIG. 1C, fabrication of the transistor continues with optional removal of portions of the pad oxide (104) at edges of the trenches (110) to form recesses (112), commonly by etching in dilute hydrofluoric acid (HF) or dilute buffered HF. The IC (100) is situated in a process chamber and exposed to a nitrogen containing plasma (114), commonly produced by flowing N2 gas at 250 to 2000 sccm into the process chamber in which the IC (100) has been situated, flowing an inert gas such as He, Ar, Ne, Kr or Xe, at 10 to 1000 sccm, into the process chamber, to produce a total pressure of 2 to 100 millitorr, and generating the plasma by supplying 250 to 4000 watts of RF power to the N2 and inert gases, for 15 to 180 seconds. Nitrogen atoms (116) diffuse from the nitrogen containing plasma (114) to the IC (100) and diffuse into a surface layer of STI sidewalls (117) of the STI trenches (110) to form surface embedded nitrogen atoms (118), at a density of $1 \cdot 10^{16}$ to $3 \cdot 10^{16}$ atoms/cm$^2$.

In an alternate embodiment, the plasma may be produced by adding NH3 gas to the N2 and inert gases at a rate of 250 to 2000 sccm.

Figure 1D:
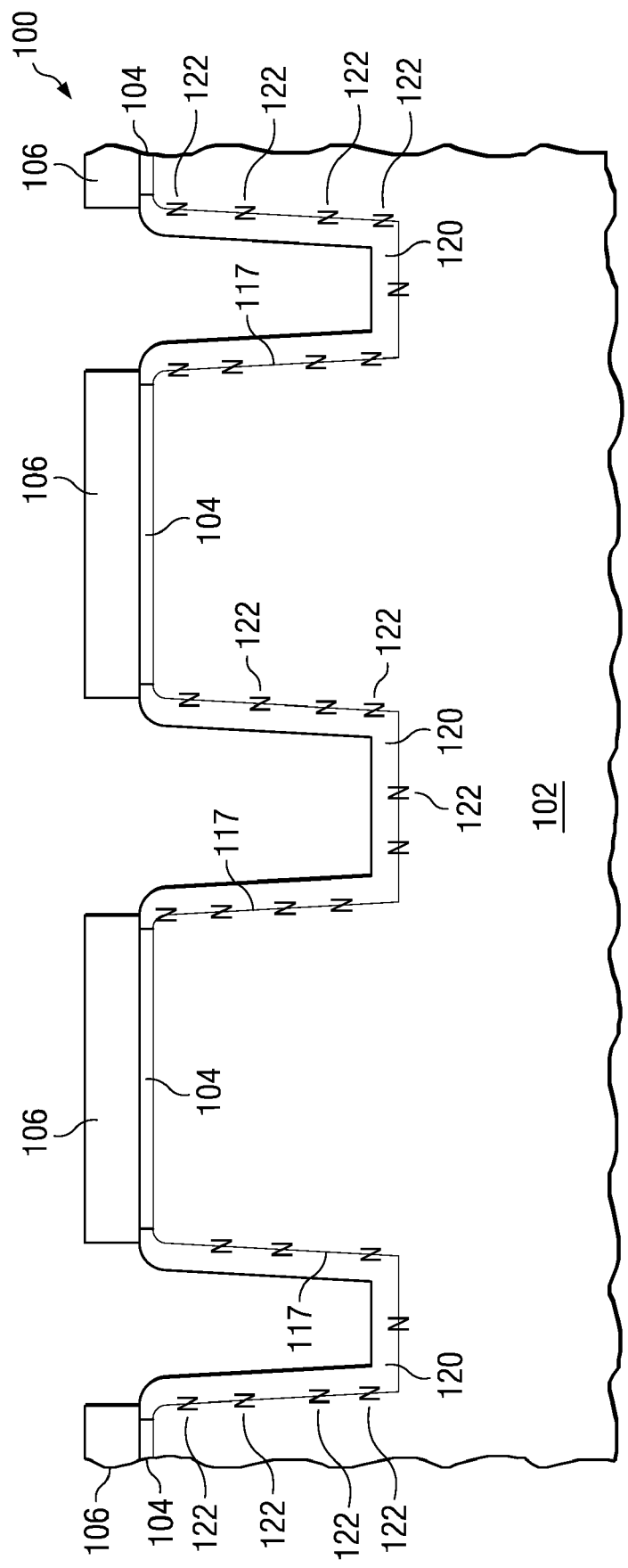

Referring to FIG. 1D, fabrication of the transistor continues with formation of an STI liner oxide (120) on the STI sidewalls (117), by a process that includes nitrogen-containing and oxygen-containing gases in an ambient during oxide growth. In a preferred embodiment, the IC (100) is situated in an oxidation furnace, and NO is flowed into the oxidation furnace at a rate of 250 to 3000 sccm to produce a pressure of 50 to 760 torr. The IC (100) is heated to 750 C to 1150 C by the oxidation furnace to grow the STI liner oxide (120) 1 nanometer to 15 nanometers thick on the STI sidewalls (117), while retaining $1.2 \cdot 10^{15}$ to $3.2 \cdot 10^{15}$ atoms/cm$^2$, preferably $2.0 \cdot 10^{15}$ to $2.4 \cdot 10^{15}$ atoms/cm$^2$ of nitrogen (122) at an interface between the substrate (102) and the STI liner oxide (120).

In alternate embodiments, any of the following gas combinations may be flowed into the oxidation furnace during formation of the STI liner oxide (120): N2O; N2O and NO; N2O, NO and N2; N2O, NO, N2 and O2; NO and N2; NO, N2 and O2; or N2 and O2; at the following flow rates: 500 to 6000 sccm of N20; 250 to 3000 sccm of NO, 250 to 3000 sccm of N2, and 250 to 3000 sccm of O2.

Figure 1E:
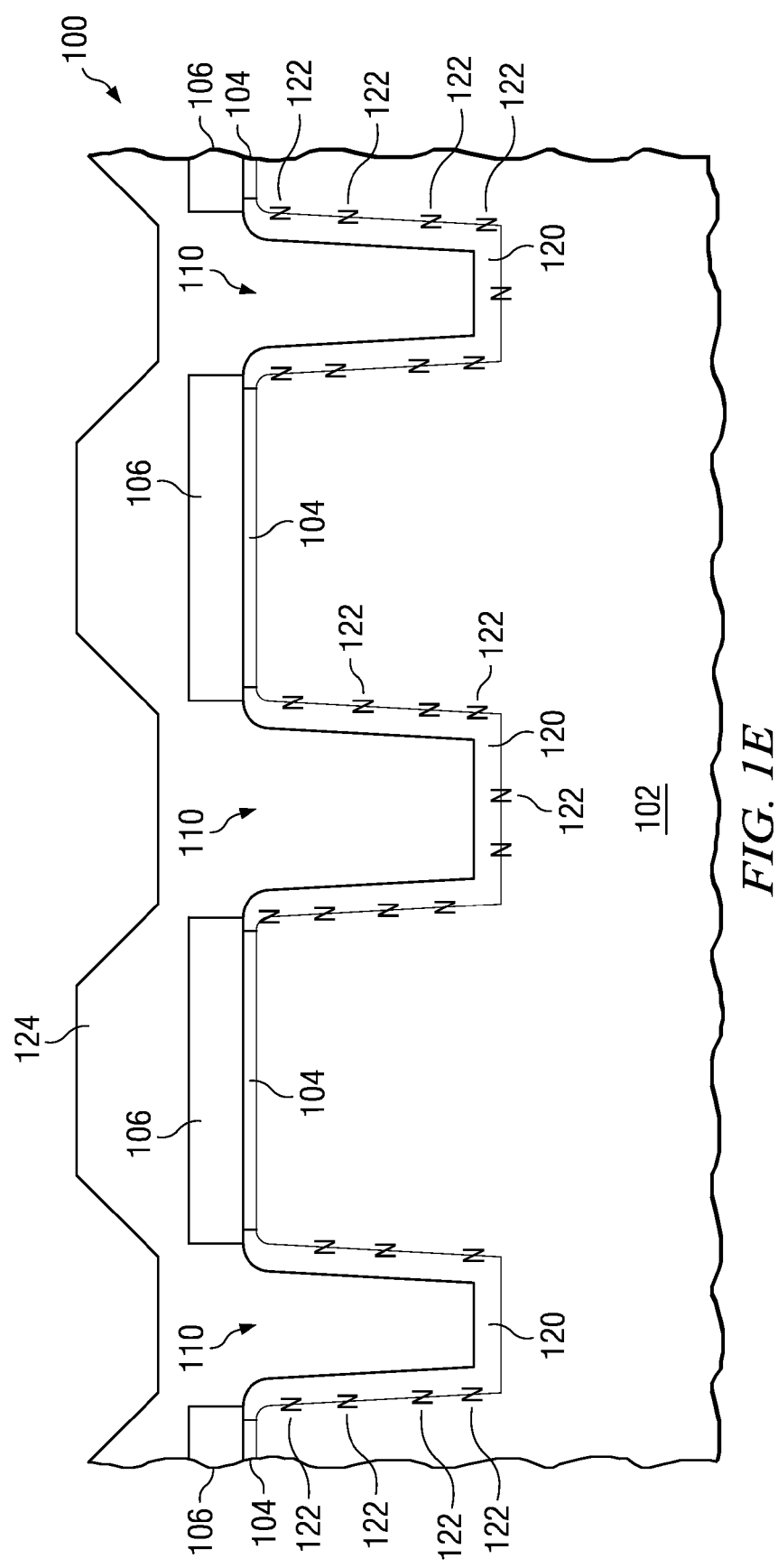

Referring to FIG. 1E, fabrication of the transistor continues with formation an STI fill oxide (124), commonly silicon dioxide 400 to 1000 nanometers thick by a high density plasma (HDP) process. The STI fill oxide (124) fills in the STI trenches (110) and covers the active area hard mask (106).

Figure 1F:
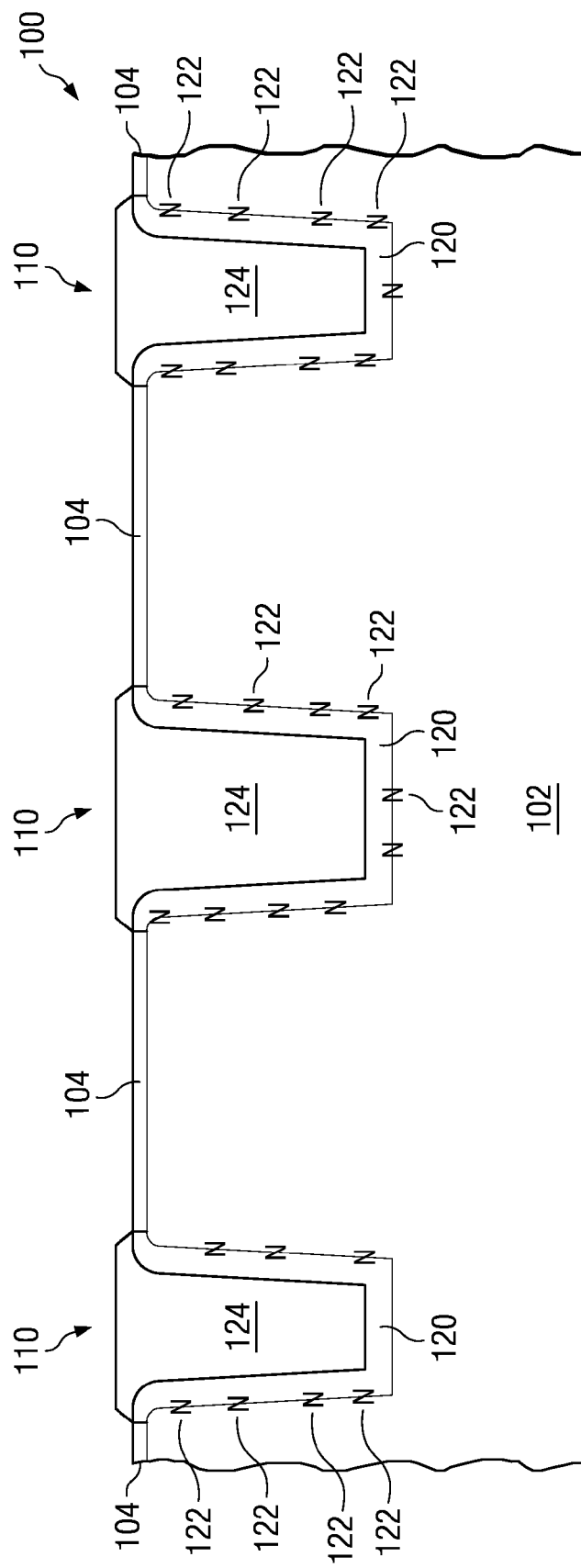

Referring to FIG. 1F, fabrication of the transistor continues with planarization of the STI fill oxide (124), commonly by a chemical mechanical polishing (CMP) process, to remove STI fill oxide material from a top surface of the active area hard mask layer, and to bring a top surface of the STI fill oxide (124) in the STI trenches (110) within 100 nanometers of a top surface of the pad oxide (104). After the CMP process, active area hard mask material is removed, commonly in a wet etch process using phosphoric acid.

Figure 1G:
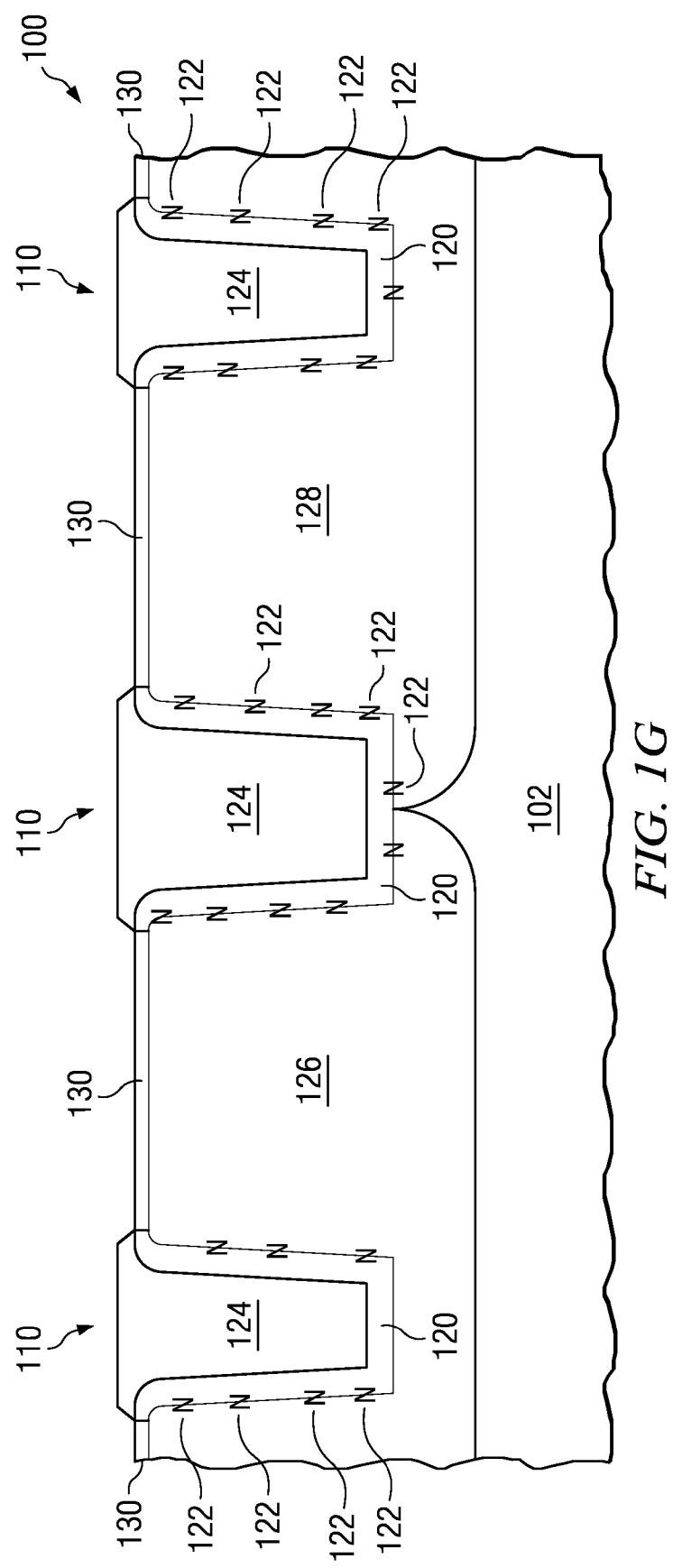

Referring to FIG. 1G, fabrication of the transistor continues with formation of a p-type well (126) in the substrate (102), commonly by ion implantation of p-type dopants such as boron, typically in several steps, at doses of $1 \cdot 10^{11}$ to $1 \cdot 10^{14}$ cm$^{-2}$ at energies of 10 to 300 keV. An n-type well (128) is formed in the substrate (102) adjacent to the p-type well (126), commonly by ion implantation of n-type dopants such as phosphorus and arsenic, typically in several steps, at doses of $1 \cdot 10^{11}$ to $1 \cdot 10^{14}$ cm$^{-2}$ at energies of 5 to 750 keV. It is common practice to locate a boundary between an n-type well (128) and a p-type well (126) under an STI trench (110) as depicted in FIG. 1G.

Figure 1H:
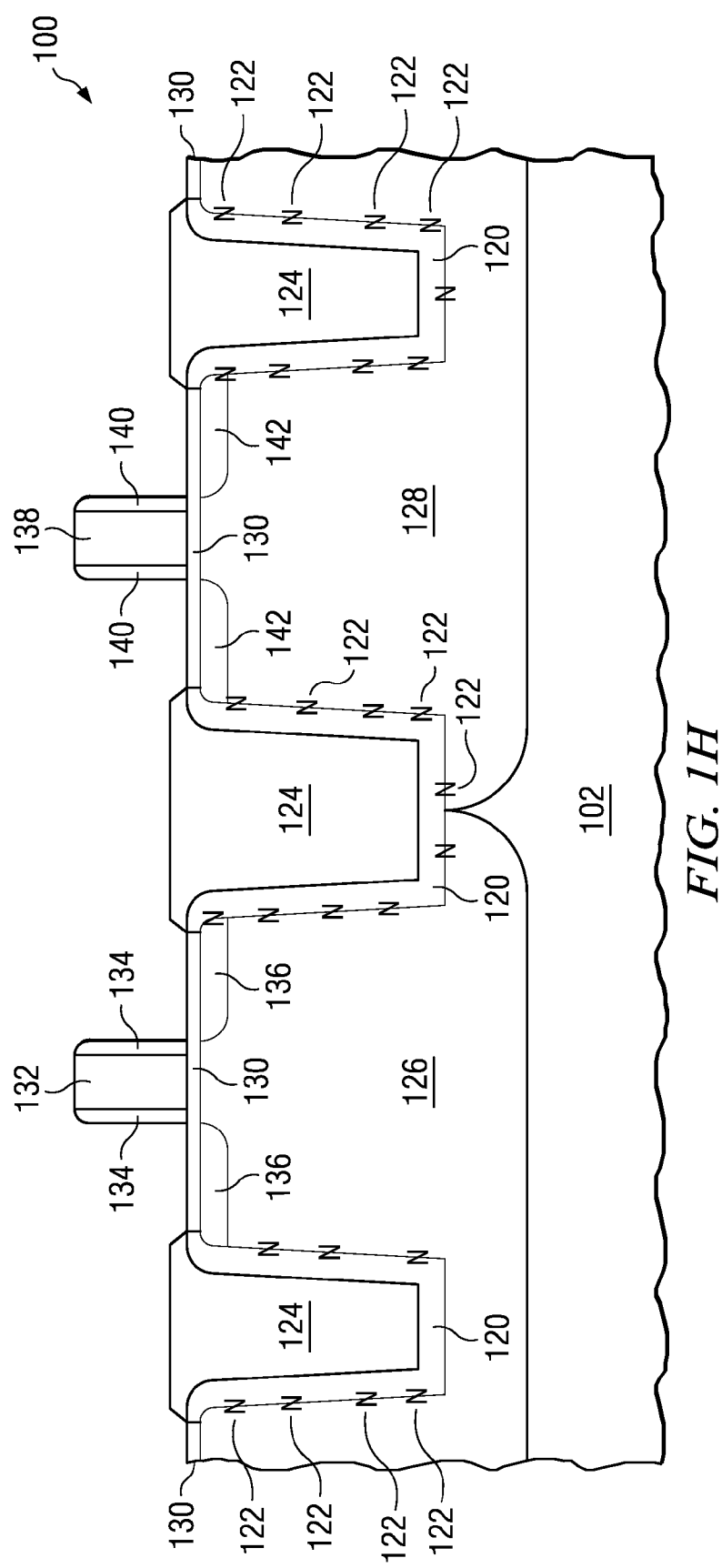

Referring to FIG. 1H, fabrication of the transistor continues with formation of a gate dielectric layer (130), typically silicon dioxide, silicon oxy-nitride, hafnium oxide, layers of silicon dioxide and silicon nitride, or other insulating material, commonly 1 to 5 nanometers thick, on top surfaces of the active area in the p-type well (126) and the active area in the n-type well (128). An NMOS gate (132), typically polycrystalline silicon, is formed on a top surface of the gate dielectric layer (130), by a process of deposition of a polycrystalline silicon layer 50 to 1500 nanometer thick on the top surface of the gate dielectric layer (130), forming a second photoresist pattern (not shown in FIG. 1H for clarity) on a top surface of the polycrystalline silicon layer by known photolithographic processes to define regions for the NMOS gate (132), and removing polycrystalline silicon exposed by the second photoresist pattern using known etching techniques. NMDD spacers (134) are formed on lateral surfaces of the NMOS gate (132), typically of layers of silicon dioxide and/or silicon nitride, by processes including oxidation of a surface layer of the polycrystalline silicon material in the NMOS gate (132), and deposition of silicon dioxide and/or silicon nitride on the NMOS gate, followed by anisotropic etchback to remove deposited material from horizontal surfaces of the IC (100) and leave deposited material on vertical surfaces of the IC (100). NMOS medium doped drain regions (NMDD regions) (136) are formed in the active area in the p-type well (126) adjacent to the NMOS gate (132) by ion implantation of n-type dopants such as phosphorus and arsenic, typically in several steps, at doses of $1 \cdot 10^{13}$ to $1 \cdot 10^{15}$ cm$^{-2}$ at energies of 1 to 50 keV, followed by an anneal process to repair damage to the p-type well (126) done by the ion implantation process. During formation of the NMDD regions (136), the active area in the N-type well (128) is shielded from the ion implanted n-type dopants by a third photoresist pattern (not shown in FIG. 1H for clarity).

Still referring to FIG. 1H, a PMOS gate (138), typically polycrystalline silicon, is formed on a top surface of the gate dielectric layer (130), by a process of deposition of a polycrystalline silicon layer 50 to 1500 nanometer thick on the top surface of the gate dielectric layer (130), forming a fourth photoresist pattern (not shown in FIG. 1H for clarity) on a top surface of the polycrystalline silicon layer by known photolithographic processes to define regions for the PMOS gate (138), and removing polycrystalline silicon exposed by the fourth photoresist pattern using known etching techniques. PMDD spacers (140) are formed on lateral surfaces of the PMOS gate (138), typically of layers of silicon dioxide and/or silicon nitride, by processes including oxidation of a surface layer of the polycrystalline silicon material in the PMOS gate (138), and deposition of silicon dioxide and/or silicon nitride on the PMOS gate, followed by anisotropic etchback to remove deposited material from horizontal surfaces of the IC (100) and leave deposited material on vertical surfaces of the IC (100). PMOS medium doped drain regions (PMDD regions) (142) are formed in the active area in the n-type well (128) adjacent to the PMOS gate (138) by ion implantation of p-type dopants such as boron and gallium, typically in several steps, at doses of $1 \cdot 10^{13}$ to $1 \cdot 10^{15}$ cm$^{-2}$ at energies of 1 to 50 keV, followed by an anneal process to repair damage to the n-type well (128) done by the ion implantation process. During formation of the PMDD regions (142), the active area in the P-type well (128) is shielded from the ion implanted p-type dopants by a fifth photoresist pattern (not shown in FIG. 1H for clarity).

Figure 1I:
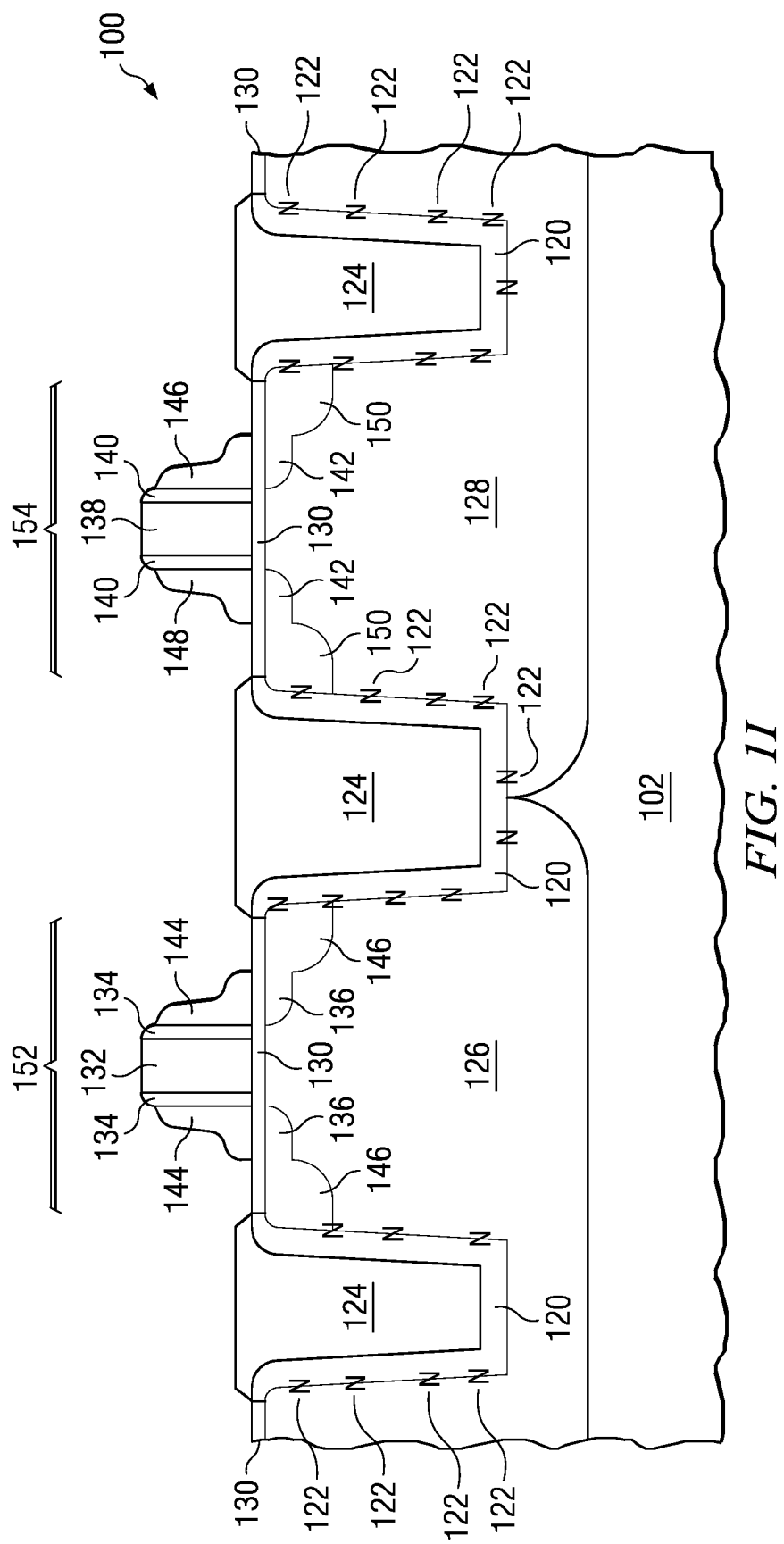

Referring to FIG. 1I, fabrication of the transistor continues with formation of NMOS gate sidewall spacers (144), typically of layers of silicon nitride and silicon dioxide by a process sequence of deposition of silicon nitride and silicon dioxide on the NMOS gate (132), followed by anisotropic etchback. NMOS source and drain regions (NSD regions) (146) are formed in the active area in the p-type well (126) adjacent to the NMOS gate sidewall spacers (144) by ion implantation of n-type dopants such as phosphorus and arsenic, typically in several steps, at doses of $1 \cdot 10^{14}$ to $1 \cdot 10^{16}$ cm$^{-2}$ at energies of 3 to 100 keV, followed by an anneal process to repair damage to the p-type well (126) done by the ion implantation process. During formation of the NSD regions (146), the active area in the N-type well (128) is shielded from the ion implanted n-type dopants by a sixth photoresist pattern (not shown in FIG. 1I for clarity).

Still referring to FIG. 1I, fabrication of the transistor continues formation of PMOS gate sidewall spacers (148), typically of layers of silicon nitride and silicon dioxide by a process sequence of deposition of silicon nitride and silicon dioxide on the PMOS gate (138), followed by anisotropic etchback. PMOS source and drain regions (PSD regions) (150) are formed in the active area in the n-type well (128) adjacent to the PMOS gate sidewall spacers (148) by ion implantation of p-type dopants such as boron and gallium, typically in several steps, at doses of $1 \cdot 10^{14}$ to $1 \cdot 10^{16}$ cm$^{-2}$ at energies of 3 to 100 keV, followed by an anneal process to repair damage to the n-type well (128) done by the ion implantation process. During formation of the PSD regions (150), the active area in the P-type well (126) is shielded from the ion implanted n-type dopants by a seventh photoresist pattern (not shown in FIG. 1I for clarity).

Still referring to FIG. 1I, p-type well (126), gate dielectric layer (130), NMOS gate (132), NMDD spacers (134), NMDD regions (136), NMOS gate sidewall spacers (144), and NSD regions (146) form an NMOS transistor (152). Similarly, n-type well (128), gate dielectric layer (130), PMOS gate (138), PMDD spacers (140), PMDD regions (142), PMOS gate sidewall spacers (148), and PSD regions (150) form a PMOS transistor (154).

Figure 1J:
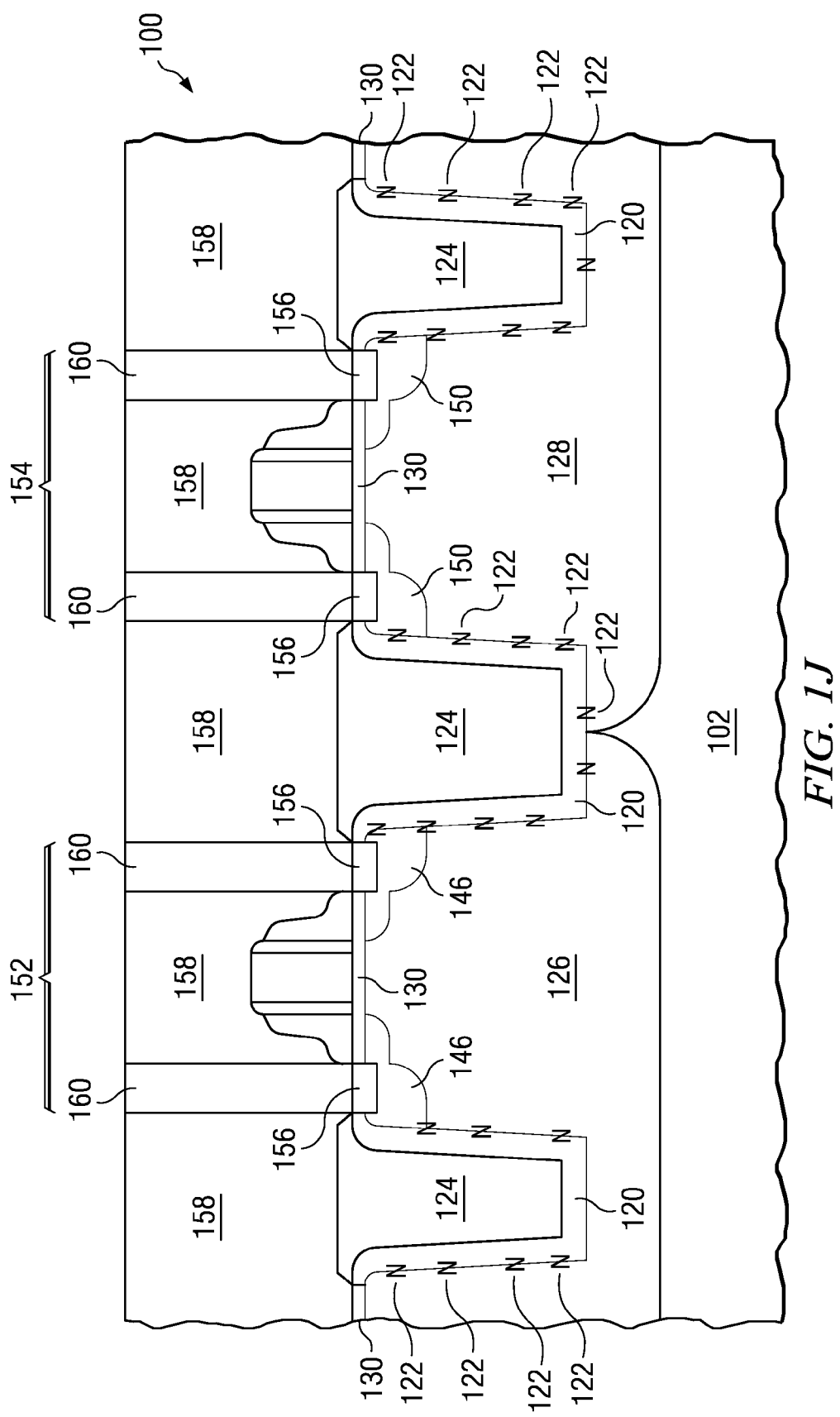

Referring to FIG. 1J, fabrication of the transistor continues with formation of metal silicide layers (156) on top surfaces of the NSD regions (146) and the PSD regions (160). A pre-metal dielectric layer (PMD) (158) is formed on top surfaces of the NMOS transistor (152) and the PMOS transistor (154), typically including a layer of silicon nitride 5 to 100 nanometers thick (not shown separately in FIG. 1J for clarity) and a layer of silicon dioxide 150 to 1000 nanometers thick. Commonly, the PMD (158) is planarized on a top surface by a CMP process. Following formation of the PMD (158), contacts (160) are formed in the PMD (156) by a process sequence including forming an eighth photoresist pattern (not shown in FIG. 1J for clarity) on a top surface of the PMD (158) to define regions for removal of PMD material, removal of PMD material in the regions defined by the eighth photoresist pattern to expose the metal silicide layers (156) on the NSD regions (146) and the PSD regions (150), and filling the regions defined by the eighth photoresist pattern with a contact metal, typically tungsten, commonly by deposition of the contact fill metal followed by selective removal of the contact fill metal from the top surface of the PMD (158). The contacts (160) provide electrical connections to the NMOS transistor (152) and PMOS transistor (154).

The process sequences described above in reference to FIG. 1C and FIG. 1D are advantageous because the nitrogen atoms (122) at the interface between the substrate (102) and the STI liner oxide (120) at a density of $1.2 \cdot 10^{15}$ to $3.2 \cdot 10^{15}$ atoms/cm$^2$, preferably $1.2 \cdot 10^{15}$ to $3.2 \cdot 10^{15}$ atoms/cm$^2$, produce a compressive stress in the p-type well (126) under the NMOS gate (132) and in the n-type well (128) under the PMOS gate (138) of 100 to 200 MPa higher than with no nitrogen atoms.

Figure 2A:
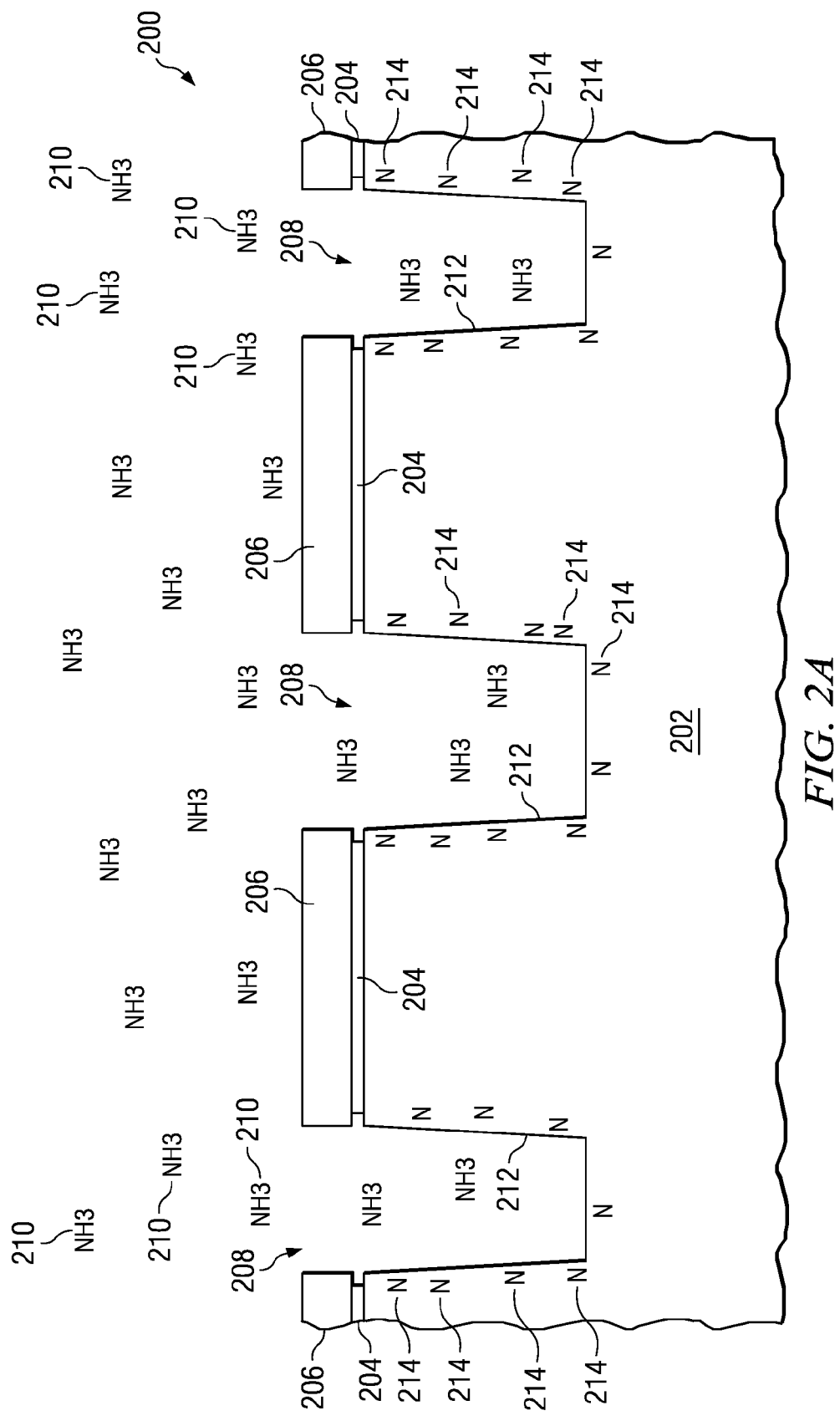
FIG. 2A and FIG. 2B are cross-section of an IC depicting alternate embodiments of processes for nitridating the STI trench sidewalls.
Figure 2B:
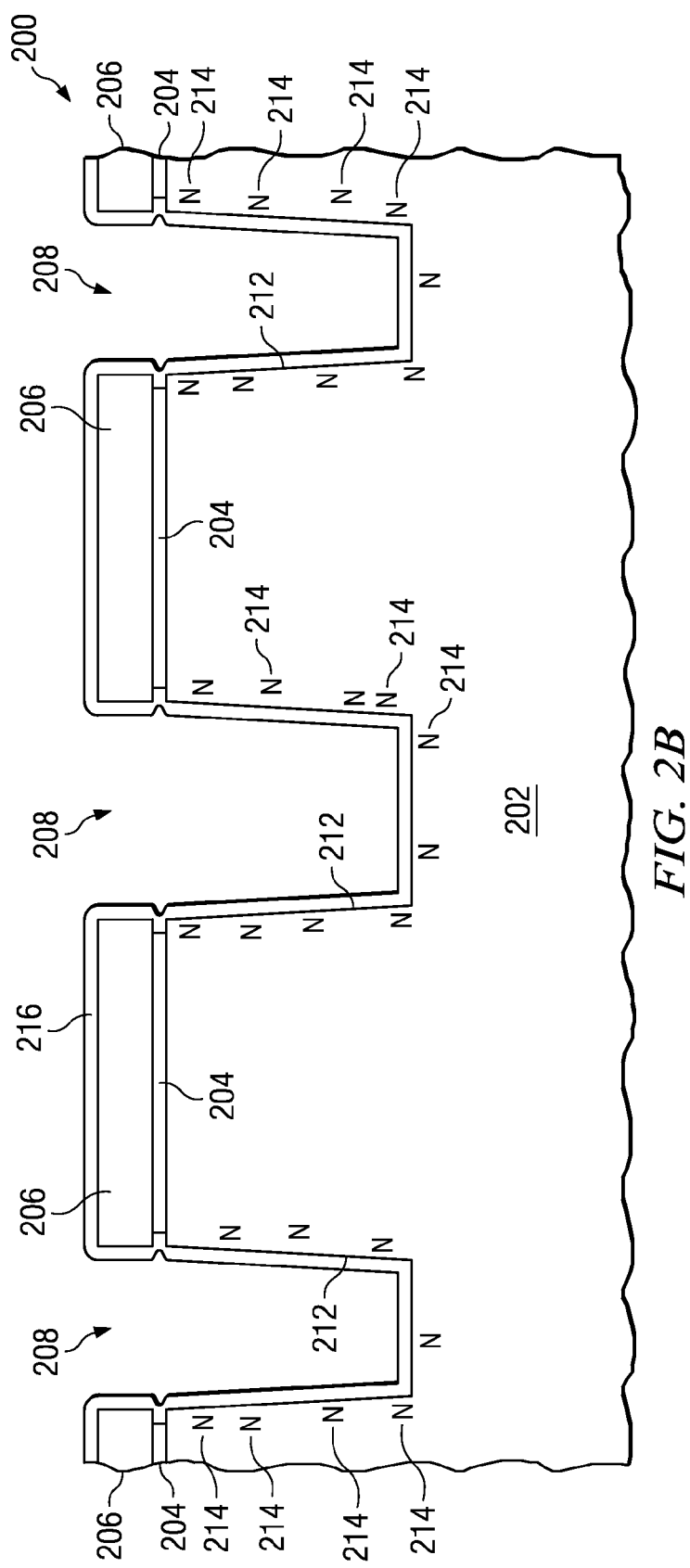

FIG. 2A and FIG. 2B are cross-section of an IC depicting alternate embodiments of processes for nitridating the STI trench sidewalls.

Referring to FIG. 2A, in an alternate embodiment, formation of surface embedded nitrogen atoms is accomplished by thermal nitridation in an NH3 gas ambient. An IC (200) includes a substrate (202), a layer of pad oxide (204) and a layer of active area hard mask (206). STI trenches (208) have been formed in the substrate (202), pad oxide (204) and active area hard mask (206). In the instant embodiment, the IC (200) is situated in a rapid thermal processor (not shown in FIG. 2A for clarity) while NH3 gas is flowed into the rapid thermal processor at a rate of 500 to 6000 sccm to produce a pressure in the rapid thermal processor of 250 to 1500 torr. The IC (200) is heated to 750 C to 1000 C by the rapid thermal processor for 15 to 180 seconds. NH3 molecules (210) diffuse to the STI sidewalls (212) and dissociate into N and H atoms. N atoms diffuse into a surface layer of the STI sidewalls (212) to form surface embedded nitrogen atoms (214), at a density of $1 \cdot 10^{16}$ to $3 \cdot 10^{16}$ atoms/cm$^2$.

In a further embodiment, a combination of NH3 gas, and any of N2 gas, He gas, Ar gas, Ne gas, Kr gas or Xe gas is flowed into the rapid thermal processor at flow rates of 250 to 3000 sccm of NH3 gas and 250 to 3000 sccm of N2 gas, He gas, Ar gas, Ne gas, Kr gas or Xe gas to produce a pressure in the rapid thermal processor of 250 to 1500 torr. The IC (200) is heated to 750 C to 1000 C for 15 to 180 seconds to form surface embedded nitrogen atoms (214), at a density of $1 \cdot 10^{16}$ to $3 \cdot 10^{16}$ atoms/cm$^2$.

In another embodiment, depicted in FIG. 2B, IC (200) is depicted after STI trenches (208) have been formed. IC (100) is situated in a chemical vapor deposition (CVD) chamber (not shown in FIG. 2B for clarity). IC (200) is heated to 100 C to 300 C by the CVD chamber while reactive gases such as Si2Cl6 and NH3 are flowed into the CVD chamber. A plasma is formed in the reactive gases which causes a nitrogen containing layer (216), for example, silicon nitride, from 0.2 to 1.6 nanometers thick, to be deposited on the STI trench sidewalls (212). Nitrogen atoms from the nitrogen containing film (216) diffuse into the STI sidewalls (212) to form surface embedded nitrogen atoms (214), at a density of $1 \cdot 10^{16}$ to $3 \cdot 10^{16}$ atoms/cm$^2$.

After formation of the nitrogen atom layers by the processes described in reference to embodiments depicted in FIG. 2A and FIG. 2B, fabrication of the transistor continues with formation of an STI liner oxide on the STI sidewalls, by a process that includes nitrogen-containing and oxygen-containing gases in an ambient during oxide growth, as discussed above in reference to FIG. 1D, in order to maintain nitrogen atoms at an interface between the substrate and the STI liner oxide. In a preferred embodiment, the IC is situated in an oxidation furnace, and NO is flowed into the oxidation furnace at a rate of 250 to 3000 sccm to produce a pressure of 50 to 760 torr. The IC is heated to 750 C to 1150 C by the oxidation furnace to grow the STI liner oxide 1 nanometer to 15 nanometers thick on the STI sidewalls, while retaining $1.2 \cdot 10^{15}$ to $3.2 \cdot 10^{15}$ atoms/cm$^2$, preferably $2.0 \cdot 10^{15}$ to $2.4 \cdot 10^{15}$ atoms/cm$^2$ of nitrogen at the interface between the substrate and the STI liner oxide.

In alternate embodiments, any of the following gas combinations may be flowed into the oxidation furnace during formation of the STI liner oxide: N2O; N2O and NO; N2O, NO and N2; N2O, NO, N2 and O2; NO and N2; NO, N2 and O2; or N2 and O2; at the following flow rates: 500 to 6000 sccm of N20; 250 to 3000 sccm of NO, 250 to 3000 sccm of N2, and 250 to 3000 sccm of O2.

Those skilled in the art to which the invention relates will appreciate that the described implementations are merely illustrative example embodiments, and that there are many other embodiments and variations of embodiments that can be implemented within the scope of the claimed invention.

What is claimed is:

1. A method of forming an integrated circuit, comprising the steps of:
   providing a semiconductor substrate;
   removing a portion of said semiconductor substrate to form shallow trench isolation (STI) trenches in said semiconductor substrate;
   forming surface embedded nitrogen atoms in sidewalls of said STI trenches, at a density of $1.0 \cdot 10^{16}$ to $3.0 \cdot 10^{16}$ atoms/cm$^2$;
   forming an STI liner oxide on said STI trench sidewalls by a process of thermal oxidation that includes nitrogen in an oxidation ambient during growth of the STI liner oxide, such that the density of said surface embedded nitrogen atoms is $2.0 \cdot 10^{15}$ to $2.4 \cdot 10^{15}$ atoms/cm$^2$, in which said step of forming an STI liner oxide further comprises the steps of:
   providing an oxidation furnace;
   situating said integrated circuit in said oxidation furnace;
   flowing nitrogen-containing and oxygen-containing gases into said oxidation furnace;
   adjusting a pressure in said oxidation furnace to be 50 to 760 torr;
   heating said integrated circuit to 750 C to 1150 C using heaters in said oxidation furnace;
   growing an oxide 1 nanometer to 15 nanometers thick on said STI trench sidewalls in said oxidation furnace; and
   removing said integrated circuit from said oxidation furnace.

2. The method of claim 1, in which said nitrogen-containing and oxygen-containing gases are selected from the group consisting of:
   NO gas;
   N2O gas;
   NO gas and N2O gas;
   NO gas, N2O gas and N2 gas;
   NO gas, N2O gas, N2 gas and O2 gas;
   NO gas and N2 gas;
   NO gas, N2 gas and O2 gas; and
   N2 gas and O2 gas.

3. The method of claim 2, wherein said STI trenches are between 300 and 600 nanometers deep.

4. The method of claim 3, further comprising the steps of:
   forming a p-type well in said semiconductor substrate with a boundary under one or more said STI trenches;
   forming an n-type well in said semiconductor substrate with a boundary under one or more said STI trenches;
   forming an n-channel MOS transistor in said p-type well;
   forming a p-channel MOS transistor in said n-type well;
   forming a pre-metal dielectric (PMD) layer on a top surface of said n-channel MOS transistor and a top surface of said p-channel MOS transistor; and
   forming metal contacts in said PMD layer connected to said n-channel MOS transistor and a top surface of said p-channel MOS transistor.

5. The method of claim 4, in which said step of forming surface embedded nitrogen atoms further comprises the steps of:
   providing a process chamber;
   situating said integrated circuit in said process chamber;
   flowing N2 gas at 250 to 2000 sccm into said process chamber;
   flowing an any combination of He gas, Ar gas, Ne gas, Kr gas or Xe gas at 10 to 1000 sccm into said process chamber;
   adjusting a pressure in said process chamber to be 2 to 100 millitorr;
   providing 250 to 4000 watts of RF power to said process chamber to form a nitrogen containing plasma in said reaction chamber;
   exposing said integrated circuit to said nitrogen containing plasma for 15 to 180 seconds; and
   removing said integrated circuit from said process chamber.

6. The method of claim 5, further comprising the step of flowing NH3 gas at 250 to 2000 sccm into said process chamber.

7. The method of claim 4, in which said step of forming surface embedded nitrogen atoms further comprises the steps of:
   providing a rapid thermal processor;
   situating said integrated circuit in said rapid thermal processor;
   flowing NH3 gas 500 to 6000 sccm into said rapid thermal processor;
   adjusting a pressure in said rapid thermal processor to be 250 to 1500 torr;
   heating said integrated circuit to 750 C to 1000 C for 15 to 180 seconds using heaters in said rapid thermal processor; and
   removing said integrated circuit from said rapid thermal processor.

8. The method of claim 4, in which said step of forming surface embedded nitrogen atoms further comprises the steps of:
   providing a chemical vapor deposition chamber;
   situating said integrated circuit in said chemical vapor deposition chamber;
   flowing Si2Cl6 gas and NH3 gas into said chemical vapor deposition chamber;
   providing RF power to said chemical vapor deposition chamber to form a plasma in said Si2Cl6 gas and NH3 gas;
   forming silicon nitride 0.2 to 1.6 nanometers thick on said sidewalls of said STI trenches from the reaction of said Si2Cl6 gas and NH3 in said plasma; and
   removing said integrated circuit from said chemical vapor deposition chamber.

9. A method of forming a transistor, comprising the steps of:
   providing a semiconductor substrate;
   removing a first portion of said semiconductor substrate to form a first STI trench 300 to 600 nanometers deep in said semiconductor substrate;
   removing a second portion of said semiconductor substrate to form a second STI trench 300 to 600 nanometers deep in said semiconductor substrate, wherein an active area of said semiconductor substrate between said first STI trench and said second STI trench is less than 1 micron wide;
   forming surface embedded nitrogen atoms in sidewalls of said STI trenches, at a density of $1.0 \cdot 10^{16}$ to $3.0 \cdot 10^{16}$ atoms/cm$^2$;
   forming an STI liner oxide on said STI trench sidewalls by a process of thermal oxidation that includes nitrogen in an oxidation ambient during growth of the STI liner oxide, such that the density of said surface embedded nitrogen atoms is $1.0 \cdot 10^{15}$ to $3.0 \cdot 10^{15}$ atoms/cm$^2$, by a process comprising the steps of:
   providing an oxidation furnace;
   situating said integrated circuit in said oxidation furnace;

flowing nitrogen-containing and oxygen-containing gases into said oxidation furnace, whereby said nitrogen-containing and oxygen-containing gases are selected from the group consisting of:
NO gas;
N2O gas;
NO gas and N2O gas;
NO gas, N2O gas and N2 gas;
NO gas, N2O gas, N2 gas and O2 gas;
NO gas and N2 gas;
NO gas, N2 gas and O2 gas; and
N2 gas and O2 gas;
adjusting a pressure in said oxidation furnace to be 50 to 760 torr;
heating said integrated circuit to 750 C to 1150 C using heaters in said oxidation furnace;
growing an oxide 1 nanometer to 15 nanometers thick on said STI trench sidewalls; and
removing said integrated circuit from said oxidation furnace;
filling said STI trenches with an STI fill oxide comprised of silicon dioxide;
planarizing said STI fill oxide to within 100 nanometers of a top surface of said pad oxide layer; and
forming a well in a said active area by ion implantation of a first type of dopants at doses from $1 \cdot 10^{-11}$ to $1 \cdot 10^{-14}$ $cm^{-2}$; and
forming an MOS transistor in and on said active area, by a process comprising the steps of:
growing a gate dielectric layer 1 to 5 nanometers thick on a top surface of said active area;
forming an MOS gate on a top surface of said gate dielectric layer;
forming MDD spacers on lateral surfaces of said MOS gate;
forming MDD regions in said active area adjacent to said MOS gate by ion implantation of a second type of dopants at doses from $1 \cdot 10^{-13}$ to $1 \cdot 10^{-15}$ $cm^{-2}$;
forming MOS gate sidewall spacers on lateral surfaces of said MOS gate; and
forming source and drain regions in said active area adjacent to said MOS gate sidewall spacers by ion implantation of said second type of dopants at doses from $1 \cdot 10^{-14}$ to $1 \cdot 10^{-16}$ $cm^{-2}$.

10. The method of claim 9, in which:
said well is an n-type well;
said first type of dopants are n-type dopants;
said second type of dopants are p-type dopants; and
said MOS transistor is a p-channel MOS transistor.

11. The method of claim 10, in which said step of forming surface embedded nitrogen atoms further comprises the steps of:

providing a process chamber;
situating said semiconductor substrate in said process chamber;
flowing N2 gas at 250 to 2000 sccm into said process chamber;
flowing an any combination of He gas, Ar gas, Ne gas, Kr gas or Xe gas at 10 to 1000 sccm into said process chamber;
adjusting a pressure in said process chamber to be 2 to 100 millitorr;
providing 250 to 4000 watts of RF power to said process chamber to form a nitrogen containing plasma in said reaction chamber;
exposing said semiconductor substrate to said nitrogen containing plasma for 15 to 180 seconds; and
removing said semiconductor substrate from said process chamber.

12. The method of claim 11, further comprising the step of flowing NH3 gas at 250 to 2000 sccm into said process chamber.

13. The method of claim 10, in which said step of forming surface embedded nitrogen atoms further comprises the steps of:
providing a rapid thermal processor;
situating said semiconductor substrate in said rapid thermal processor;
flowing NH3 gas 500 to 6000 sccm into said rapid thermal processor;
adjusting a pressure in said rapid thermal processor to be 250 to 1500 torr;
heating said semiconductor substrate to 750 C to 1000 C for 15 to 180 seconds using heaters in said rapid thermal processor; and
removing said semiconductor substrate from said rapid thermal processor.

14. The method of claim 10, in which said step of forming surface embedded nitrogen atoms further comprises the steps of:
providing a chemical vapor deposition chamber;
situating said semiconductor substrate in said chemical vapor deposition chamber;
flowing Si2Cl6 gas and NH3 gas into said chemical vapor deposition chamber;
providing RF power to said chemical vapor deposition chamber to form a plasma in said Si2Cl6 gas and NH3 gas;
forming silicon nitride 0.2 to 1.6 nanometers thick on said sidewalls of said STI trenches from the reaction of said Si2Cl6 gas and NH3 in said plasma; and
removing said semiconductor substrate from said chemical vapor deposition chamber.

\* \* \* \* \*